(12) United States Patent
Anthony

(10) Patent No.: US 7,056,749 B2
(45) Date of Patent: Jun. 6, 2006

(54) SIMPLIFIED MAGNETIC MEMORY CELL

(75) Inventor: Thomas Anthony, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 41 days.

(21) Appl. No.: 10/378,210

(22) Filed: Mar. 3, 2003

(65) Prior Publication Data

US 2004/0175846 A1    Sep. 9, 2004

(51) Int. Cl.
*H01L 21/00* (2006.01)
*H01L 29/176* (2006.01)

(52) U.S. Cl. .............. 438/3; 257/295; 257/421
(58) Field of Classification Search .............. 438/3; 257/295, 421, 427
See application file for complete search history.

(56) References Cited

U.S. PATENT DOCUMENTS

| | | | |
|---|---|---|---|
| 5,956,267 A | 9/1999 | Hurst et al. | |
| 6,358,757 B1 | 3/2002 | Anthony | |
| 6,404,674 B1 | 6/2002 | Anthony et al. | |
| 6,559,511 B1 * | 5/2003 | Rizzo | 257/421 |
| 6,707,083 B1 * | 3/2004 | Hiner et al. | 257/295 |
| 2005/0030786 A1 * | 2/2005 | Deak | 365/158 |

* cited by examiner

*Primary Examiner*—Caridad Everhart (57) ABSTRACT

An exemplary magnetic memory cell comprises a ferromagnetic cladding, the cladding at least partially surrounding a non-magnetic region, a spacer layer over the ferromagnetic cladding, and a ferromagnetic data layer over at least a portion of the spacer layer.

40 Claims, 10 Drawing Sheets

SIMPLIFIED MAGNETIC MEMORY CELL

BACKGROUND

A memory chip generally comprises a plurality of memory cells that are deposited onto a silicon wafer and addressable via an array of column conducting leads (bit lines) and row conducting leads (word lines). That is, the intersection of a bit line and a word line typically constitutes the address of a memory cell. The memory cells are controlled by specialized circuits that perform functions such as identifying rows and columns from which data are read from or to which data are written. Typically, each memory cell stores data in the form of a "1" or a "0," representing a bit of data.

An array of magnetic memory cells is often called magnetic random access memory or MRAM. MRAM is generally nonvolatile memory (i.e., a solid state chip that retains data when power is turned off). At least one type of magnetic memory cell includes a data layer and a reference layer, separated from each other by at least one intermediate layer. The data layer may also be referred to as a bit layer, a storage layer, a sense layer, and/or using other known terminology. In a magnetic memory cell, a bit of data (e.g., a "1" or "0") may be stored by "writing" into the data layer via one or more conducting leads (e.g., a bit line and a word line). The write operation is typically accomplished via a write current that sets the orientation of the magnetic moment in the data layer to a predetermined direction.

Once written, the stored bit of data may be read by providing a read current through one or more conducting leads (e.g., a read line) to the magnetic memory cell. For each memory cell, the orientations of the magnetic moments of the data layer and the reference layer are either parallel (in the same direction) or anti-parallel (in different directions) to each other. The degree of parallelism affects the resistance of the cell, and this resistance can be determined by sensing (e.g., via a sense amplifier) an output current or voltage produced by the memory cell in response to the read current.

More specifically, if the magnetic moments are parallel, the resistance determined based on the output current is of a first relative value (e.g., relatively low). If the magnetic moments are anti-parallel, the resistance determined is of a second relative value (e.g., relatively high). The relative values of the two states (i.e., parallel and anti-parallel) are typically different enough to be sensed distinctly. A "1" or a "0" may be assigned to the respective relative resistance values depending on design specification.

The intermediate layer, which may also be referred to as a spacer layer, may comprise insulating material (e.g., dielectric), non-magnetic conducting material, and/or other known materials, and is usually thick enough to prevent exchange coupling between the data and reference layers. The various conducting leads which are used to address the memory cells (e.g., bit lines, word lines, and read lines), and to provide currents to pass through the data and reference layers to read data from or write data to the memory cells are provided by one or more additional layers, called conducting layer(s).

The layers described above and their respective characteristics are typical of magnetic memory cells based on tunneling magnetoresistance (TMR) effects known in the art. Other combinations of layers and characteristics may also be used to make magnetic memory cells based on TMR effects. For example, a pinned reference layer and an anti-ferromagnetic layer may also be used. This configuration of TMR memory cells is well known in the art and need not be described in more detail herein. See, for example, U.S. Pat. No. 6,404,674, issued to Anthony et al., and co-pending U.S. application Nos.: (1) Ser. No. 09/825,093, entitled "Cladded Read Conductor For A Pinned-On-The-Fly Soft Reference Layer", filed on Apr. 2, 2001; and (2) Ser. No. 09/963,171, entitled "Magneto-Resistive Device Having Soft Reference Layer", filed on Sep. 25, 2001, which are hereby incorporated by reference in their entirety for all purposes.

Still other configurations of magnetic memory cells based on other well known physical effects (e.g., giant magnetoresistance (GMR), anisotropic magnetoresistance (AMR), colossal magnetoresistance (CMR), and/or other physical effects) may be implemented with various embodiments described herein.

Throughout this application, various exemplary embodiments will be described in reference to the TMR memory cells as described above. Those skilled in the art will readily appreciate that the exemplary embodiments may also be implemented with other types of magnetic memory cells known in the art (e.g., other types of TMR memory cells, GMR memory cells, AMR memory cells, CMR memory cells, etc.) according to the requirements of a particular implementation.

Generally speaking, desirable characteristics for any configuration of memory device include increased speed, reduced power consumption, and/or lower cost. A simpler fabrication process and/or a smaller chip size may achieve lower cost. However, as magnetic memory cells become smaller, typically, higher operating current is required for achieving "write" operations. Magnetic coercivity increases as memory cell area decreases. As a result, an increased write current is generally needed to reverse the polarity of one or more layers of the memory cell. Higher operating current is undesirable because it goes hand-in-hand with higher power requirements, increased concern about electromigration, increased write circuitry area, and increased cost.

Thus, a market exists for improved memory cell configurations that can be manufactured by a simpler fabrication process and/or use lowered operating current in high density MRAM devices.

SUMMARY

Implementations of the various exemplary memory cell structures to be described herein may result in one or more advantages, including, without limitation, lowered manufacturing costs, lowered operating currents, lowered power requirements, simplified sense and write circuitry, and increased memory cell density.

An exemplary magnetic memory cell comprises a ferromagnetic cladding, the cladding at least partially surrounding a non-magnetic region, a spacer layer over the ferromagnetic cladding, and a ferromagnetic data layer over at least a portion of the spacer layer.

An exemplary method for manufacturing a magnetic memory cell comprises forming a ferromagnetic cladding, the cladding at least partially surrounding a non-magnetic region, forming a spacer layer over the ferromagnetic cladding, and forming a ferromagnetic data layer over at least a portion of the spacer layer.

Other embodiments and implementations are also described below.

DETAILED DESCRIPTION

I. Overview

Exemplary improved magnetic memory cells and exemplary manufacturing processes for making the magnetic memory cells are described herein.

Section II describes an exemplary magnetic memory cell in the prior art.

Section III describes exemplary improved magnetic memory cells.

Section IV describes exemplary processes for making the exemplary improved magnetic memory cells.

Section V describes an exemplary memory array.

II. An Exemplary Memory Cell Configuration in the Prior Art

Figure 1:
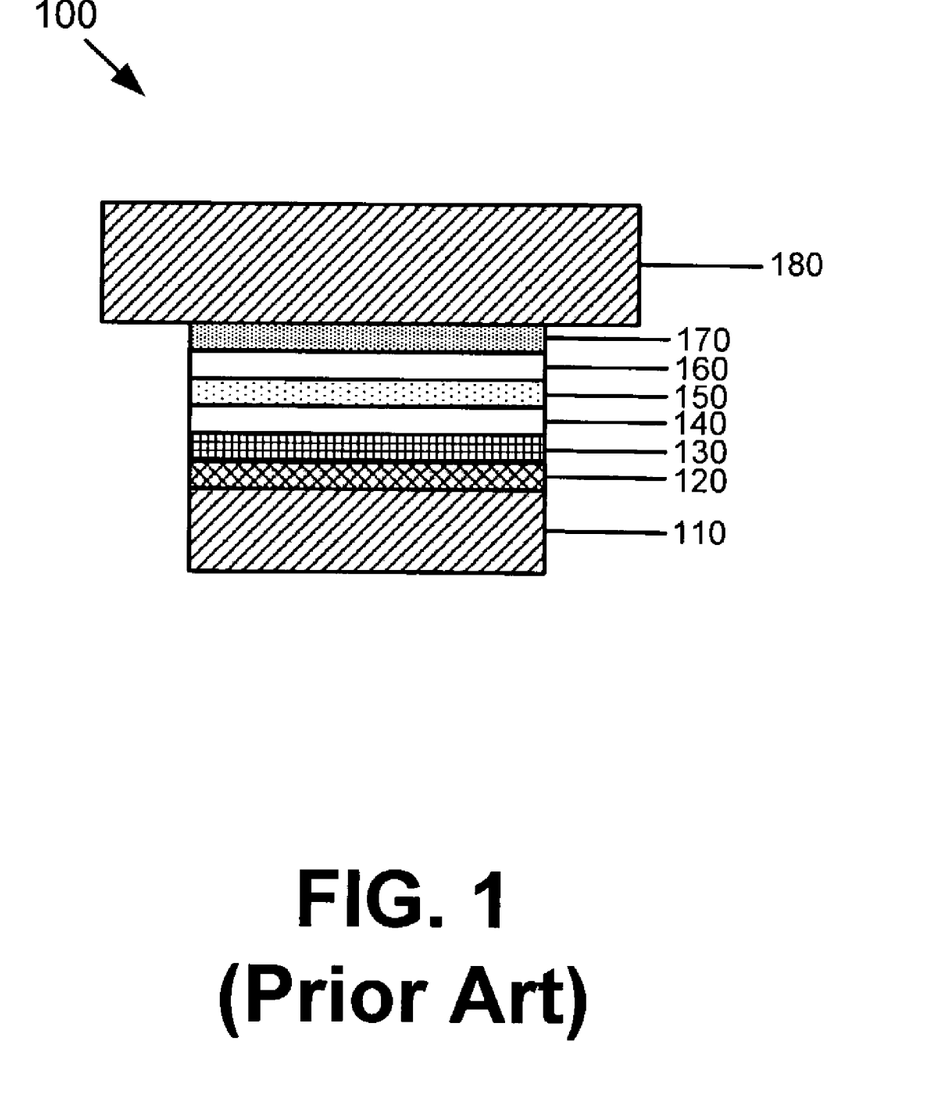
FIG. 1 illustrates an exemplary magnetic memory cell configuration in the prior art.

FIG. 1 illustrates an elevation view of an exemplary magnetic memory cell 100 in the prior art. Generally, a memory cell may be made as top-pinned (where the reference/pinned layer is on top of the data/sense layer) or bottom-pinned (where the reference/pinned layer is below the data/sense layer). For ease of explanation, only the bottom-pinned configuration is shown in FIG. 1 and referenced to in the description of various exemplary embodiments herein. The configuration described herein is merely illustrative. Thus, one skilled in the art would readily appreciate that other configurations (e.g., top-pinned, etc.) may also be implemented in accordance with any particular design requirement.

A. An Exemplary Bottom-Pinned Memory Cell in the Prior Art

The memory cell 100 includes a first conductor 110, a seed layer 120, an antiferromagnetic (AFM) layer 130, a reference layer 140, a spacer layer 150, a data layer 160, a protective cap layer 170, and a second conductor 180. In the exemplary configuration illustrated in FIG. 1, the first conductor 110 and the second conductor 180 are orthogonal to each other and are collectively used for both write and read operations. One skilled in the art will recognize that the memory cell configuration as illustrated in FIG. 1 is merely illustrative. Other configurations, for example, configurations having additional conductor(s) (e.g., separate conductor(s) for read operations) are also known in the prior art.

The first and second conductors 110, 180, may be made of Cu, Al, AlCu, Ta, W, Au, Ag, alloys of one or more of the above, and/or other conducting material(s) and alloy(s). The conductors may be formed by known deposition techniques known in the art (e.g., sputtering, evaporation, electroplating, etc.).

The seed layer 120 generally enhances crystalline alignment within the AFM layer 130. Exemplary materials of a seed layer include Ta, Ru, NiFe, Cu, or combinations of these materials.

The AFM layer 130 generally enhances magnetic stability in the reference layer 140. Exemplary materials include IrMn, FeMn, NiMn, PtMn, and/or other well known materials.

The reference layer 140 may comprise a single layer of material or multiple layers of materials. For example, the reference layer 140 may comprise one or more ferromagnetic materials. In an exemplary embodiment, ferromagnetic materials suitable for the reference layer 140 include nickel iron (NiFe), nickel iron cobalt (NiFeCo), cobalt iron (CoFe), other magnetic alloys of NiFe and Co, amorphous ferromagnetic alloys, PERMALLOY™, and other materials.

In an exemplary embodiment, the spacer layer 150 is a tunnel barrier layer (e.g., if the memory cell 100 is a TMR memory cell). In this embodiment, the spacer layer 150 may be made of silicon oxide ($SiO_2$), silicon nitride ($SiN_x$), magnesium oxide (MgO), aluminum oxide ($Al_2O_3$), aluminum nitride ($AlN_x$), tantalum oxide ($TaO_x$), and/or other insulating material(s).

In another exemplary embodiment, the spacer layer 150 is a non-magnetic conducting layer (e.g., if the memory cell 100 is a GMR memory cell). In this embodiment, the spacer layer 150 may be made of copper (Cu), gold (Au), silver (Ag), The data layer 160 may comprise one or more ferromagnetic materials. In an exemplary embodiment, ferromagnetic materials suitable for the data layer 120 include, without limitation, nickel iron (NiFe), nickel iron cobalt (NiFeCo), cobalt iron (CoFe), other magnetic alloys of NiFe and Co, doped amorphous ferromagnetic alloys, PERMALLOY™, and other materials.

The protective cap layer 170 protects the data layer 160 from the environment (e.g., reduces oxidation of the data layer 160) and may be formed using any suitable material known in the art, for example, Ta, TaN, Cr, Al or Ti.

B. Problems Associated with Certain Aspects of the Exemplary Bottom-Pinned Memory Cell in the Prior Art 1. Fabrication Complexity Generally, the physical configurations of magnetic memory cells in the prior art, such as the one shown in FIG. 1, is very complex, thus, requiring complex fabrication steps. Small dimensions and multiple layers of the conventional magnetic memory cells require precise, and numerous masking steps, with an associated risk of having some shorted memory cells. For example, making an electrical connection between conductor 180 and the data layer 160 has typically been challenging because any spillage of the conducting material onto the reference layer 140 can cause a short circuit and render the affected magnetic memory cell(s) useless.

2. Corrosion and Special Annealing Requirements

In addition to being complex, some materials being used in the conventional magnetic memory cell are relatively prone to corrosion. For example, the AFM layer 130 is generally made of Mn or alloys containing Mn, which is prone to corrosion.

Further, due to the small size and patterned shape, the magnetic orientation of the conventional reference layer 140 has to be set with the aid of the AFM layer 130. Generally, the AFM layer's ability to enhance the magnetic orientation of the reference layer 140 is best carried out when the AFM layer is exposed to a magnetic field at a high temperature. This is typically done by annealing the entire memory chip or memory wafer (including the AFM layers and the reference layers) at a high temperature while exposing the chip or wafer to a magnetic field. Magnetic annealing at a high temperatures may be undesirable because such high temperature may cause damages to other components on the memory chip and magnetic annealing is a time consuming, expensive processing step.

3. Fringe Magnetic Fields

Again, due to the small size and patterned shape of the conventional reference layer 140, fringe magnetic fields produced at the edges of the reference layer 140 during read/write operations may unacceptably affect nearby data layers. The fringe magnetic fields can influence the switching characteristics of the memory cell. Typically, the data layer 160 has an inherent resistance (i.e., based on the data layer's material and thickness) that is overcome when attempting to change the magnetic orientation of the data layer 160 (e.g., during a write operation). The inherent resistance, or coercivity, can be affected by other magnetic fields present near the data layer 160, such as the fringe magnetic fields emanating from the edges of the reference layer 140. As a result, data stored in the data layer 160 may be corrupted.

One way to reduce the fringe magnetic fields is by building a multi-layered reference layer 140. For example, in an exemplary multi-layer reference layer made of CoFe/Ru/CoFe, the top and bottom layers of the reference layer 140 have different magnetic orientations that may substantially cancel each other out at the edges of the reference layer.

An exemplary improved magnetic memory cell is described below. The exemplary improved magnetic memory cell may, depending on its particular configuration and operating environment, potentially overcome (or at least reduce) one or more of the problems associated with the conventional magnetic memory cell described above.

III. Exemplary Improved Magnetic Memory Cells

A. A First Exemplary Improved Magnetic Memory Cell

Figure 2A:
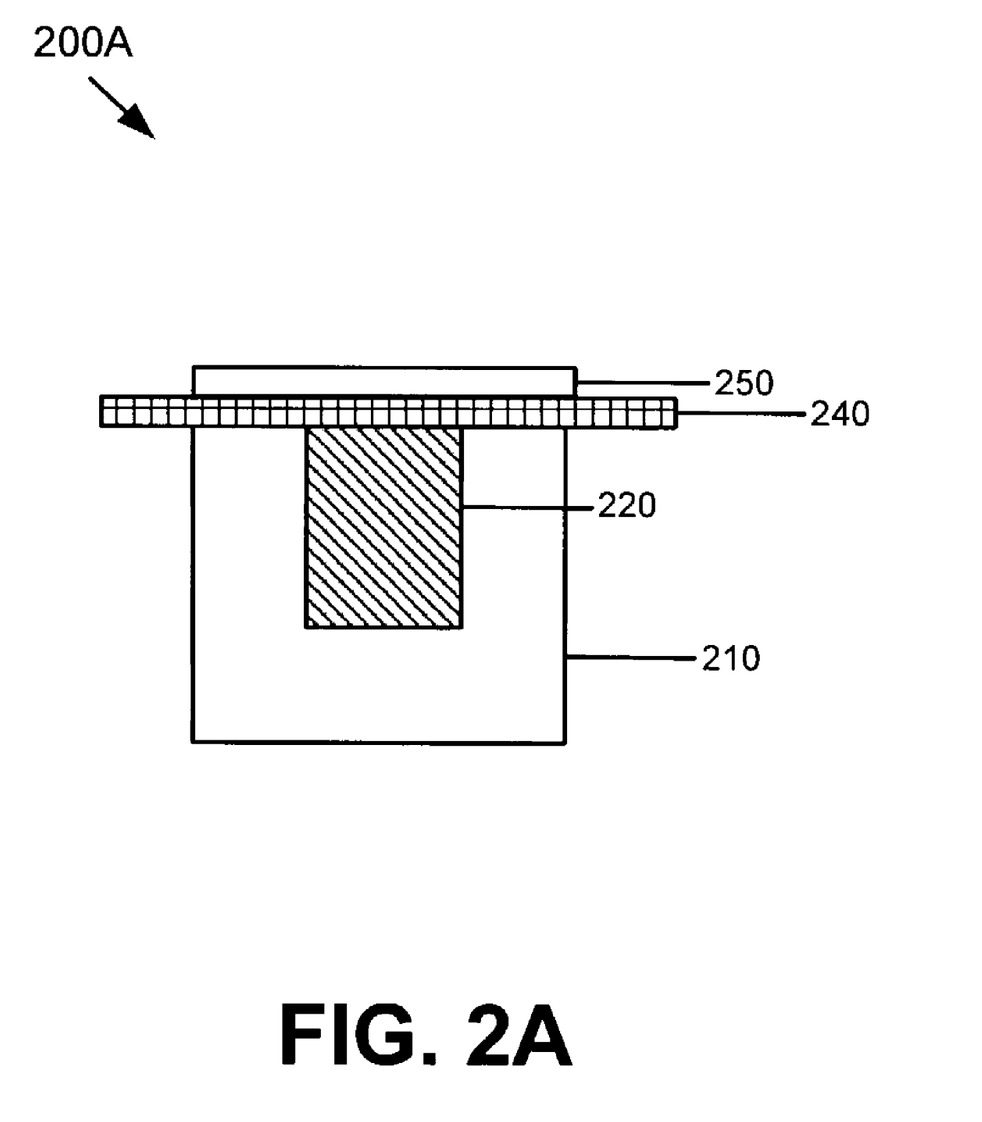
FIG. 2A illustrates an improved exemplary magnetic memory cell configuration.

FIG. 2A illustrates an exemplary improved magnetic memory cell 200A. The exemplary memory cell 200A includes at least a ferromagnetic cladding 210, a non-magnetic region 220, a spacer layer 240, and a data layer 250. In the exemplary embodiment, the ferromagnetic cladding 210 serves as the magnetic reference layer in the magnetic memory cell 200A.

For ease of explanation, only the bottom-pinned configuration is shown in FIG. 2 and referenced to in the description of various exemplary embodiments herein. The configuration described herein is merely illustrative. Thus, one skilled in the art would readily appreciate that other configurations (e.g., top-pinned, etc.) may also be implemented in accordance with any particular design requirements.

1. The Ferromagnetic Cladding

In an exemplary implementation, the materials that may be used for the ferromagnetic cladding 210 have one or more of the following characteristics: (1) reasonably high magnetic permeability (e.g., $\mu$>100); (2) high magnetic polarization (e.g., NiFe, CoFe, etc.); and (3) a well-defined magnetic state when the cladding is not subjected to a write current (e.g., during a read operation).

For example, the ferromagnetic cladding 210 may be made of one or more materials which have conventionally been a reference layer. Examples of such materials include, without limitation, nickel iron (NiFe), nickel iron cobalt (NiFeCo), cobalt iron (CoFe), other magnetic alloys of NiFe and Co, amorphous ferromagnetic alloys, PERMALLOY™, and other materials. See, for example, soft ferromagnetic alloys as described in U.S. Pat. No. 4,402,043, issued to Koon, which is hereby incorporated by reference for all purposes.

In an exemplary implementation, during read operations, electron tunneling current flows between ferromagnetic cladding 210 and data layer 250 through the spacer layer 240. In an exemplary implementation appropriate for some contemporary memory devices, a suitable thickness for the reference cladding 210 is approximately 5 to 150 nanometers. Of course, the appropriate thickness in any given implementation will depend on geometric, design, and operational characteristics, as well as on the characteristics of the other layers.

Generally, the ferromagnetic cladding 210 does not need to be patterned to bit size and has an extended length. In accordance with well-known shape anisotropy, the magnetic orientation of a ferromagnetic material generally sets along the long dimension of the body of the ferromagnetic material. Thus, the magnetic orientation of the ferromagnetic cladding 210 should generally occur in a specific direction without necessarily requiring additional orientation enhancement from another source, such as the AFM layer in the conventional magnetic memory cell.

Further, because the ferromagnetic cladding 210 has an extended length, fringe magnetic fields emanating from the edges of the cladding (i.e., toward the ends of the memory array) tend to have little or no effect on the data layers 250 sharing the cladding 210 along its length.

2. The Non-Magnetic Region

The non-magnetic region 220 is located within the ferromagnetic cladding 210. In one implementation, the non-magnetic region 220 comprises a high conductivity material, such as Cu. Other conducting materials known in the art may also be used, for example, Al, AlCu, Ta, W, Au, Ag, alloys of one or more of the above, and/or other conducting material(s) and alloy(s). The conducting material may be formed by known damascene processes using deposition techniques known in the art (e.g., sputtering, evaporation, electroplating, etc.).

In an exemplary implementation appropriate for some contemporary memory devices, the conducting material is thick enough to achieve desired conducting functions for read/write operations. For example, in an exemplary implementation appropriate for some contemporary memory devices, a suitable range of thickness for the non-magnetic region 220 is approximately 100 to 500 nanometers. Of course, the appropriate thickness in any given implementation will depend on geometric, design, and operational characteristics, as well as on the characteristics of the other layers.

In another exemplary implementation, the non-magnetic region 220 comprises insulating material, such as a dielectric material. In this embodiment, the ferromagnetic cladding 210 itself (absent the conducting material within the non-magnetic region 220) functions as a conductor in cooperation with another conductor (not shown) during read/write operations.

3. The Spacer Layer

In an exemplary embodiment, the spacer layer 240 is a tunnel barrier layer (e.g., if the memory cell 100 is a TMR memory cell). In this embodiment, the spacer layer 150 may be made of silicon oxide ($SiO_2$), silicon nitride ($SiN_x$), magnesium oxide (MgO), aluminum oxide ($Al_2O_3$), aluminum nitride ($AlN_x$), tantalum oxide ($TaO_x$), and/or other insulating material(s). In an exemplary implementation appropriate for some contemporary memory devices, the thickness of a tunnel barrier layer is approximately 0.5 to 10 nanometers. Of course, the appropriate thickness in any given implementation will depend on geometric, design, and operational characteristics, as well as on the characteristics of the other layers.

In another exemplary embodiment, the spacer layer 240 is a non-magnetic conducting layer (e.g., if the memory cell 100 is a GMR memory cell). For example, the spacer layer 240 may be made of Cu, Au, Ag, and/or alloys of these elements. In an exemplary implementation appropriate for some contemporary memory devices, the thickness of a non-magnetic conducting layer is approximately 0.5 to 5 nanometers. Of course, the appropriate thickness in any given implementation will depend on geometric, design, and operational characteristics, as well as on the characteristics of the other layers.

In an exemplary implementation, the tunnel barrier spacer layer 240 is formed to cover substantially all of the memory array. Thus, the spacer layer 240 effectively protects the ferromagnetic cladding 210 from any potential spillage of conducting materials (i.e., when forming a top conductor (not shown)); thereby reducing the risk of having shorted memory cells and greatly simplifying the process to electrically isolate conductors contacting the reference layer portion (i.e., the ferromagnetic cladding 210) of the memory cell from conductors contacting the data layer portion of the memory cell.

4. The Data Layer

The data layer 250 may comprise one or more ferromagnetic materials. In an exemplary embodiment, ferromagnetic materials suitable for the data layer 250 include, without limitation, nickel iron (NiFe), nickel iron cobalt (NiFeCo), cobalt iron (CoFe), other magnetic alloys of NiFe and Co, amorphous ferromagnetic alloys, PERMALLOY™, and other materials.

B. A Second Exemplary Improved Magnetic Memory Cell

Figure 2B:
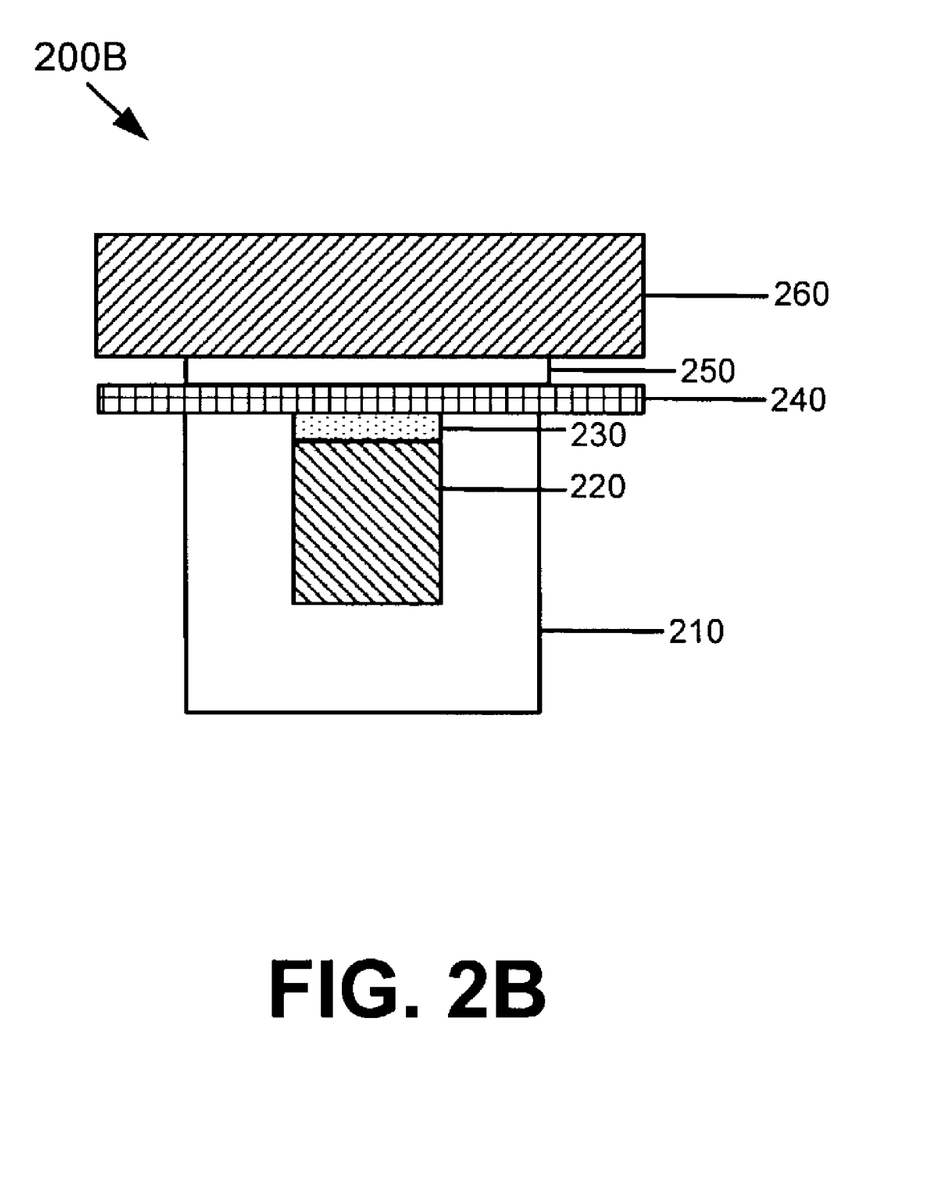
FIG. 2B illustrates another improved exemplary magnetic memory cell configuration.

FIG. 2B illustrates another exemplary improved magnetic memory cell 200B. The exemplary memory cell 200B includes at least the features illustrated in FIG. 2A, a cap 230 between the non-magnetic region 220 and the spacer layer 240, and a conductor 260 over the ferromagnetic data layer 250. In the exemplary embodiment, the ferromagnetic cladding 210 serves as the magnetic reference layer in the magnetic memory cell 200B.

In an exemplary implementation, the cap 230 may be formed on top of the non-magnetic region 220 to reduce or eliminate electrical tunneling between data layer 250 and non-magnetic region 220 during read operations. In another exemplary implementation, the cap 230 may substantially cover both the non-magnetic region 220 and the ferromagnetic cladding 210. Various implementations of the cap 230 are provided in Section III.B.1 below.

For ease of explanation, only the bottom-pinned configuration is shown in FIG. 2B and referenced to in the description of various exemplary embodiments herein. The configuration described herein is merely illustrative. Thus, one skilled in the art would readily appreciate that other configurations (e.g., top-pinned, etc.) may also be implemented in accordance with any particular design requirements.

1. The Cap a. A Cap of Dielectric Material(s)

Figure 3A:
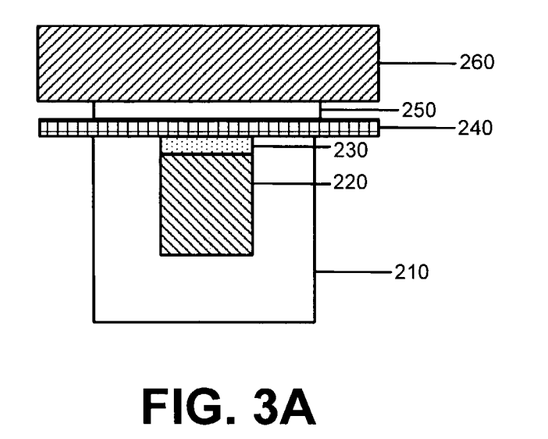
FIGS. 3A–3C illustrate exemplary magnetic memory cells having different caps.

In an exemplary implementation, the cap 230 may comprise one or more dielectric materials. The dielectric material may be formed as thin as desired so long as it substantially covers the non-magnetic region 220. An exemplary magnetic memory cell having a cap 230 that comprises one or more dielectric material is shown in FIG. 3A. An exemplary process for making this type of cap is provided in Section IV.B below.

Generally speaking, a cap 230 comprising dielectric material provides highly effective shielding of any electrical tunneling effects caused by a conducting material in the non-magnetic region 220 during read operations.

b. A Cap of Ferromagnetic Material(s)

Figure 3B:
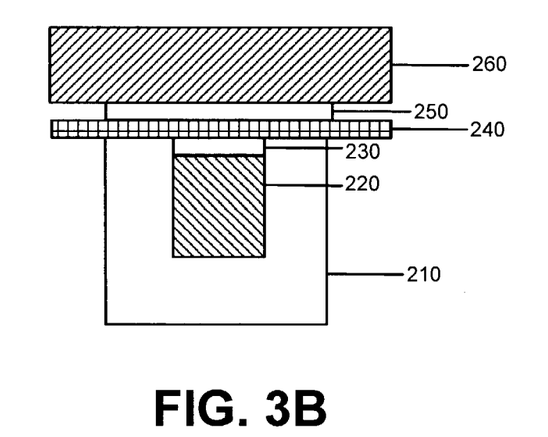

In another exemplary implementation, the cap 230 may comprise one or more ferromagnetic materials. In addition to the ferromagnetic materials generally usable for the ferromagnetic cladding 210, the cap 230 may comprise of half-metallic ferromagnets (e.g., $Fe_3O_4$ and $CrO_2$), other ferromagnetic materials having a high spin polarization, and/or materials having a permeability that is significantly lower than NiFe or CoFe. Further, the cap 230 may also be made of multiple layers of materials that have a low permeability in the direction perpendicular to the length of the ferromagnetic cladding 210 (e.g., artificial antiferromagnet or synthetic antiferromagnet). For example, ferromagnetic layers made of NiFe, Co, Fe or CoFe may be separated by thin layers of non-magnetic elements such as Ru, Cu, Cr, Os, or Re. An exemplary magnetic memory cell having a cap 230 that comprises one or more ferromagnetic material is shown in FIG. 3B.

In another exemplary implementation featuring a ferromagnetic cap (not shown), the cap 230 may be extended such that it substantially covers both the non-magnetic region 220 and the ferromagnetic cladding 210.

An exemplary process for making a ferromagnetic cap (whether the cap 230 substantially covers the non-magnetic region 220 or substantially covers both the non-magnetic region 220 and the ferromagnetic cladding 210) is provided in Section IV.B below.

The ferromagnetic cap 230 is preferably thin to prevent shunting of magnetic flux from the cladding during write operations. In an exemplary implementation appropriate for some contemporary memory devices, the thickness of the ferromagnetic cap 230 is approximately 1 to 5 nanometers. The appropriate thickness in any given implementation will depend on geometric, design, and operational characteristics, as well as on the characteristics of the other layers.

Generally speaking, electrical tunneling between the ferromagnetic cap 230 and the data layer 250 does not need to be prevented. In fact, in the case of a ferromagnetic cap 230, the cap is considered to be part of the ferromagnetic cladding 210, which serves as the reference layer of the magnetic memory cell. Hence, in accordance with an exemplary implementation, the magnetic properties of ferromagnetic cap 230 should generally be chosen to enhance the magnetoresistance and to maintain a stable magnetic orientation of the ferromagnetic cladding 210.

c. A Cap of Both Ferromagnetic and Dielectric Materials

Figure 3C:
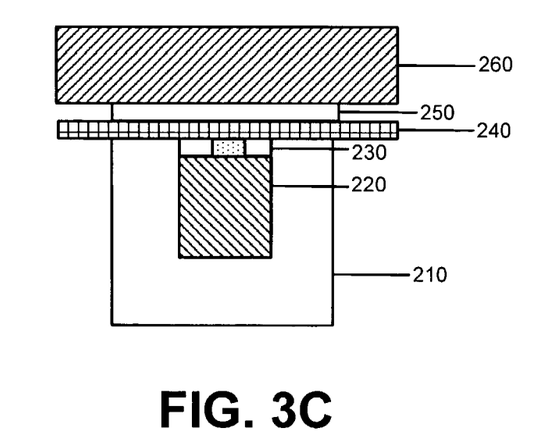

In yet another exemplary embodiment, the cap 230 includes both ferromagnetic material and dielectric material. An exemplary magnetic memory cell having a cap 230 that comprises one or more dielectric and ferromagnetic materials is shown in FIG. 3C. An exemplary process for making this type of cap is provided in Section IV.C below.

Generally speaking, a cap 230 comprising both ferromagnetic material and dielectric material may impart the benefits of both types of materials. Namely, the dielectric portion prevents electrical conduction between non-magnetic region 220 and the data layer 250, while the ferromagnetic portion increases the area for tunneling conduction between the ferromagnetic cladding and the data layer.

2. The Conductor

The conductor 260, may be made of Cu, Al, AlCu, Ta, W, Au, Ag, alloys of one or more of the above, and/or other conducting material(s) and alloy(s). The conductor may be formed by known deposition and patterning techniques known in the art (e.g., sputtering, evaporation, electroplating, etc.). In an exemplary implementation appropriate for some contemporary memory devices, the thickness of a conductor is approximately 50 to 500 nm. Of course, the appropriate thickness in any given implementation will depend on geometric, design, and operational characteristics, as well as on the characteristics of the other layers.

The physical configuration of the conductor 260 is merely illustrative. One skilled in the art will recognize that other configurations of the conductor 260 may be used in accordance with the requirements of a particular implementation. For example, the conductor 260 does not necessarily have to be in contact with the data layer 250. Further, one or more other intervening layers (not shown) may be formed between the conductor 260 and the data layer 250.

C. Advantages of the Exemplary Improved Magnetic Memory Cells

Depending on the particular implementation, the magnetic memory cells having the exemplary configurations described above may exhibit one or more advantages. First, the magnetic memory cells 200A or 200B might be manufactured by a relatively simpler fabrication process (e.g., fewer masking steps, etc.) if one or more layers in the conventional magnetic memory cells may be eliminated (e.g., seed layer, AFM layer, protective cap, etc.). Eliminating some layers from a conventional magnetic memory cell may also have other benefits besides a simpler fabrication process. For example, some problems associated with the AFM layer (e.g., corrosion, high annealing temperature, etc.) might also be reduced.

In other implementations, the number of shorted magnetic memory cells may be substantially reduced if the conventional reference layer is replaced by a ferromagnetic cladding 210 that is protected by the unpatterned dielectric spacer layer 240. The unpatterned spacer layer 240 prevents spillage of conducting materials from reaching the ferromagnetic cladding 210 when forming the conductor 260. Also, by properly choosing the dimensions of the data layer 250, the conductor 260, and the ferromagnetic cladding 210, potential conduction paths between the conductor 260 and the ferromagnetic cladding 210 may be substantially eliminated. For example, if the physical configuration of the conductor 260 is narrower than the width of the data layer 250 in one dimension and if the data layer 250 is at least as wide as the ferromagnetic cladding 210 in the other (i.e., substantially orthogonal) dimension, potential conduction paths between the conductor 260 and the ferromagnetic cladding 210 may be substantially eliminated and/or reduced (see an exemplary memory array in FIG. 7).

If the ferromagnetic cladding 210 has an extended shape, this may also help to reduce damaging effects of fringe magnetic fields that might otherwise affect a majority of the data layers in the memory array.

IV. Exemplary Processes for Making the Improved Magnetic Memory Cell

Figure 4A:
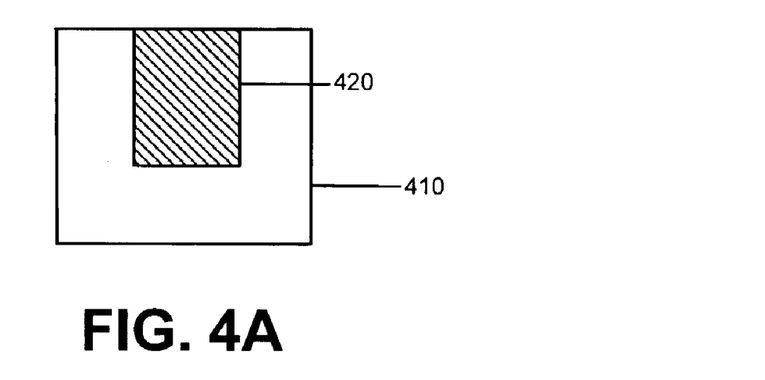
FIGS. 4A–4C illustrate an exemplary process for making the exemplary improved magnetic memory cell of FIG. 2A.

A. An Exemplary Process for Making the Exemplary Improved Magnetic Memory Cell of FIG. 2A FIGS. 4A–4C illustrate an exemplary process for manufacturing the exemplary improved memory cell as shown in FIG. 2A above. In FIG. 4A, a ferromagnetic cladding 410 and a non-magnetic region 420 are formed. The ferromagnetic cladding 410 and the non-magnetic region 420 may be formed by so-called damascene processes using deposition techniques known in the art (e.g., atomic layer deposition (ALD), sputtering, evaporation, electroplating, etc.). In an exemplary implementation, the non-magnetic region 420 is partially or wholly filled with a conducting material. In another exemplary implementation, the non-magnetic region 420 is partially or wholly filled with an insulating material, such as a dielectric.

Exemplary processes for partially or wholly cladding a conductor with a soft ferromagnetic material are disclosed in U.S. Pat. Nos. 6,358,757 and 6,404,674 and co-pending U.S. application entitled "Cladded Read Conductor For A Pinned-On-The-Fly Soft Reference Layer" bearing application Ser. No. 09/825,093, filed on Apr. 2, 2001, all assigned to the Hewlett Packard Company. These patents and the pending application are hereby incorporated by reference above for all purposes.

As used herein, the term "cladding" means a material that partially or substantially surrounds another material (e.g., surrounds one or more sides of another material). Such surrounding material could be, but need not be, physically bonded to the other material being surrounded.

Figure 4B:
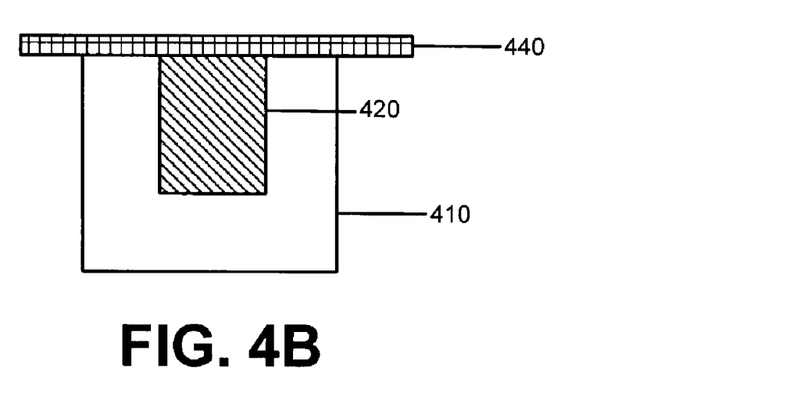

In FIG. 4B, a non-magnetic spacer layer 440 is formed via known processing methods (e.g., via sputtering, evaporation, chemical vapor depositionatomic layer deposition (ALD), and/or other known techniques). In an exemplary implementation for the case of an insulating spacer layer, the spacer layer is not patterned and may substantially cover the entire memory array. In another exemplary implementation, an optional ion cleaning process known in the art may be performed prior to depositing the spacer layer 440.

Figure 4C:
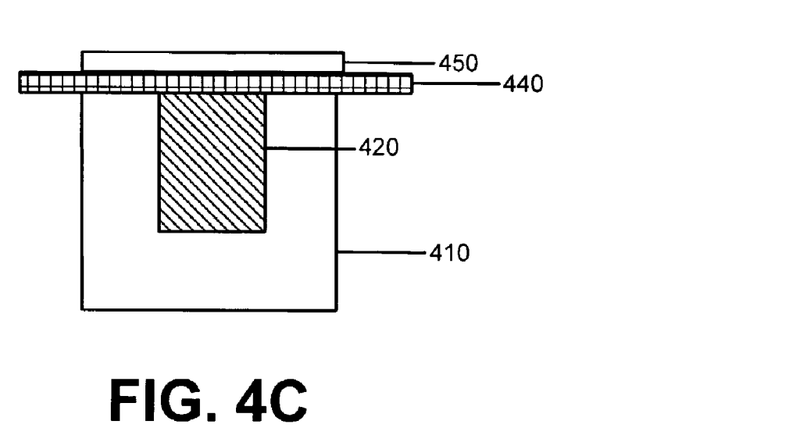

In FIG. 4C, a data layer 450 is deposited and patterned. This may be achieved using known depositing and patterning techniques or other techniques developed in the future. In general, non-magnetic spacer layer 440 and data layer 450 can be deposited sequentially, without breaking vacuum between the layers.

The manufacturing steps illustrated above are merely exemplary. Those skilled in the art will appreciate that other manufacturing steps may be used in accordance with the requirements of a particular implementation. For example, the various layers as illustrated in FIGS. 4A–4C may be formed in accordance with other manufacturing sequences (e.g., the ferromagnetic data layer 450 may be formed first and the ferromagnetic cladding 410 may be formed last at the top of the memory cell), one or more layers may be formed at the same time, one or more layers of different materials may be combined to form a single layer (e.g., a data layer), etc.

Further, the TMR memory cell illustrated above is merely exemplary. Those skilled in the art will appreciate that other types of memory cells (e.g., GMR memory cells, etc.) may be constructed according to the requirements of a particular implementation. For example, the spacer layer 430 may be a non-magnetic conducting layer for constructing a GMR memory cell.

Figure 5A:
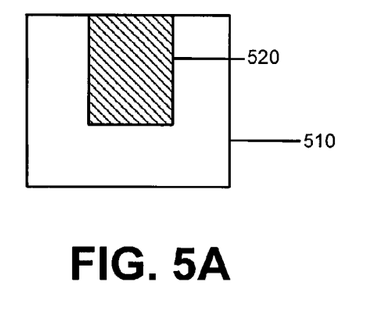
FIGS. 5A–5F illustrate an exemplary process for making the exemplary improved magnetic memory cell of FIG. 2B.

B. An Exemplary Process for Making the Exemplary Improved Magnetic Memory Cell of FIG. 2B FIGS. 5A–5F illustrate an exemplary process for manufacturing the exemplary improved memory cell as shown in FIG. 2B above. In FIG. 5A, a ferromagnetic cladding 510 and a non-magnetic region 520 are formed as described above in FIG. 4A.

Figure 5B:
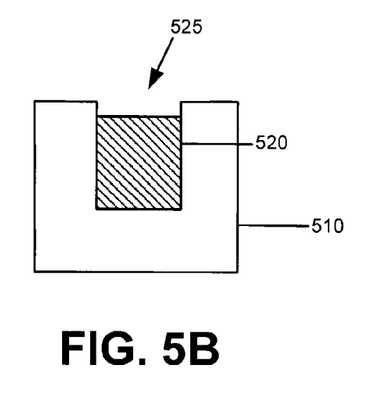

In FIG. 5B, a recess 525 in the non-magnetic region 520 is formed, for example, using a well known preferential etching process.

Figure 5C:
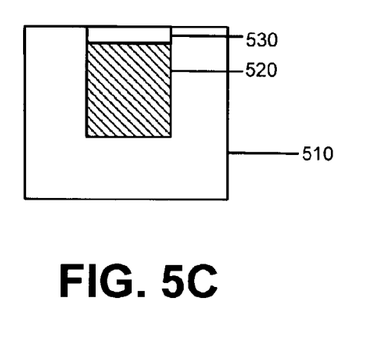

In FIG. 5C, the recess 525 is filled with a non-conducting or a ferromagnetic material. The material is then planarized, for example, using a well known CMP process, until the ferromagnetic cladding 510 is exposed, to form a cap 530. In one exemplary implementation, the non-conducting material is a dielectric material. In another exemplary implementation, the ferromagnetic material may or may not be the same material as the ferromagnetic cladding 510 (see Section III.B.1.b above). In yet another exemplary implementation, the cap 530 comprises both dielectric and ferromagnetic materials. An exemplary process for making a cap 530 having both materials is described in Section IV.C below.

In yet another exemplary implementation (not shown), the ferromagnetic cap 530 may also substantially cover the ferromagnetic cladding 510. In this implementation, the recess 525 is not created. Instead, a thin layer of ferromagnetic material is deposited and patterned to substantially align with the dimensions of the ferromagnetic cladding 510. Thus, the ferromagnetic cap 530, in this implementation, substantially covers both the non-magnetic region 520 and the ferromagnetic cladding 510.

As used herein, the term "cap" means a material that partially or wholly covers another material. Such capping material could be but need not be in physical contact with the material being covered. For example, any covering that partially or wholly covers the non-magnetic region (or substantially covers both the non-magnetic region and the ferromagnetic cladding) will be acceptable.

Figure 5D:
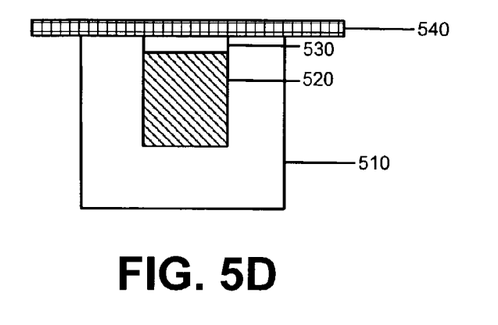

In FIG. 5D, a non-magnetic spacer layer 540 is formed as described above in FIG. 4B.

Figure 5E:
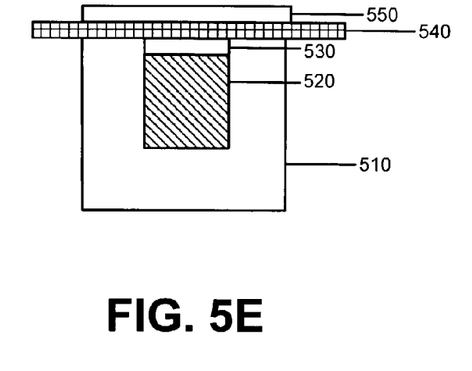

In FIG. 5E, a data layer 550 is deposited and patterned as described above in FIG. 4C.

Figure 5F:
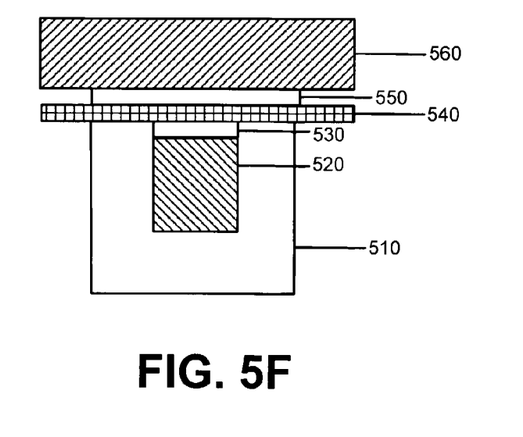

In FIG. 5F, a top conductor 560 is deposited and patterned. This may be achieved using known depositing and patterning techniques or other techniques developed in the future. The top conductor 560 does not necessarily have to be in contact with the data layer 550. In other words, one or more intervening layers (not shown) may be formed above the data layer 550 prior to forming the conductor 560.

In an exemplary implementation, the ferromagnetic cladding 510 is formed substantially orthogonally relative to the top conductor 560. Of course, one skilled in the art will recognize that other layouts of the ferromagnetic cladding 510 and the top conductor 560 may be used in accordance with the requirements of a particular implementation.

The manufacturing steps illustrated above are merely exemplary. Those skilled in the art will appreciate that other manufacturing steps may be used in accordance with the requirements of a particular implementation. For example, the various layers as illustrated in FIGS. 5A–5F may be formed in accordance with other manufacturing sequences (e.g., the top conductor 560 may be formed first as a "bottom conductor" and the ferromagnetic cladding 510 may be formed last at the top of the memory cell), one or more layers may be formed at the same time, one or more layers of different materials may be combined to form a single layer (e.g., a data layer), etc.

Further, the TMR memory cell illustrated above is merely exemplary. Those skilled in the art will appreciate that other types of memory cells (e.g., GMR memory cells, etc.) may be constructed according to the requirements of a particular implementation. For example, the spacer layer 430 may be a non-magnetic conducting layer for constructing a GMR memory cell.

C. An Exemplary Process for Making a Magnetic Memory Cell Having a Cap of Both Ferromagnetic and Insulating Materials In an exemplary process, a ferromagnetic cap 530 is first formed in accordance with FIG. 5C above. Assuming each bit (i.e., memory cell) is created in accordance with the minimum feature size available in the semiconductor fabrication technology, then a process involving a conformal deposition process known in the art may be performed to create a hole or gap in the ferromagnetic cap 530 that is smaller than the minimum feature size. Such a gap in the ferromagnetic cap 530 may enhance the magnitude of magnetic flux exiting the ferromagnetic cladding 510 during a writing operation. For example, without the gap, some fraction of the magnetic flux is shunted through the ferromagnetic cap 530, and may not interact with the data layer 550. FIGS. 6A–6I illustrate an exemplary process for creating a gap whose width is smaller than the minimum feature size and filling that gap with a dielectric material, thereby forming a cap 530 comprising both ferromagnetic and dielectric materials.

Figure 6A:
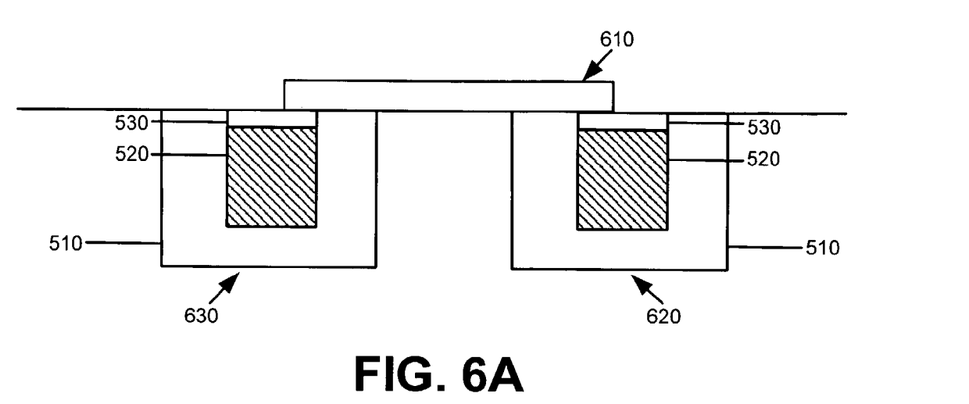
FIGS. 6A–6I illustrate an exemplary process for making the exemplary improved magnetic memory cell of FIG. 3C.

In FIG. 6A, a first sacrificial layer 610 is deposited and patterned to form a structure between two conductors 620, 630. Each conductor has a ferromagnetic cladding 510, a non-magnetic region 520, and a ferromagnetic cap 530 as described above in FIGS. 5A–5C.

Figure 6B:
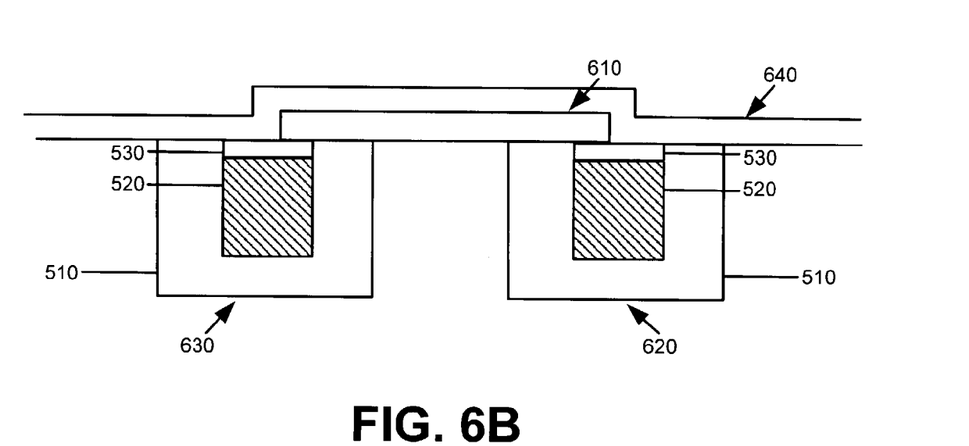

In FIG. 6B, a second sacrificial layer 640 is deposited over the patterned first sacrificial layer 610 in a conformal manner (i.e., the material has the same thickness on horizontal and vertical surfaces). Well known deposition processes can be used to create the conformal coating (e.g., ALD, sputtering or PECVD)

Figure 6C:
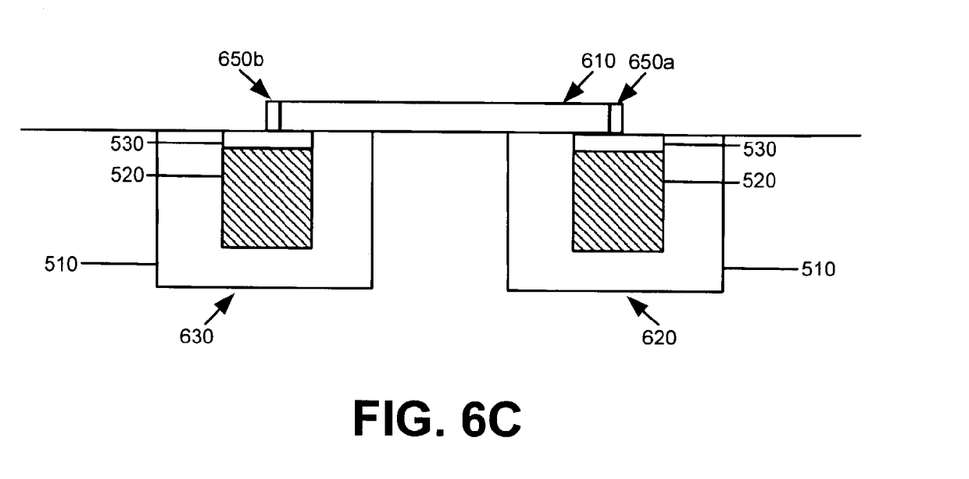

In FIG. 6C, an anisotropic etching process well known in the art is performed to form conformal structures 650a, 650b.

Figure 6D:
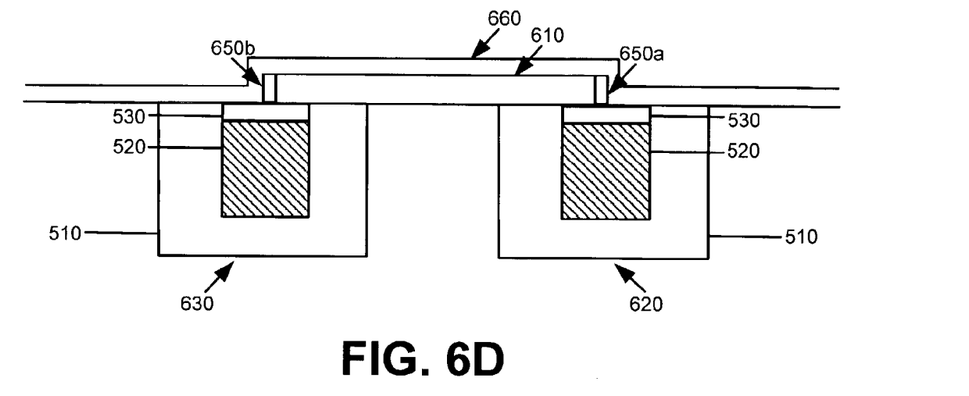

In FIG. 6D, a third sacrificial layer 660 (e.g., a layer of dielectric material) of is deposited.

Figure 6E:
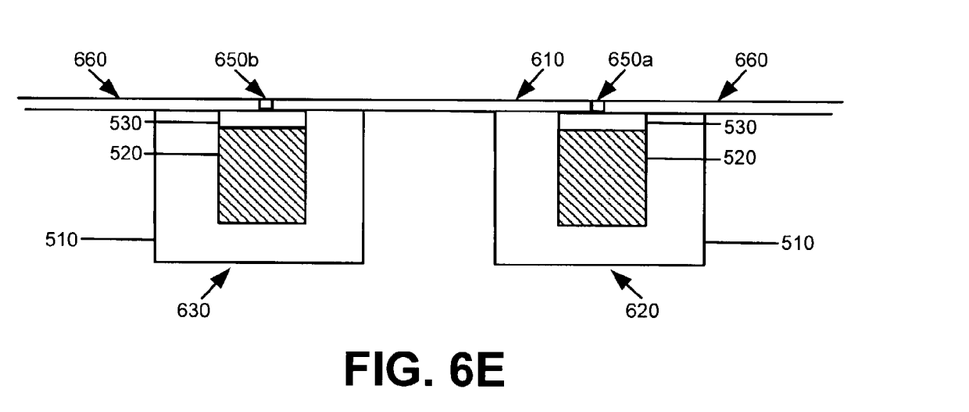

In FIG. 6E the substrate surface is planarized using well know processes, such as chemical-mechanical polishing (CMP).

Figure 6F:
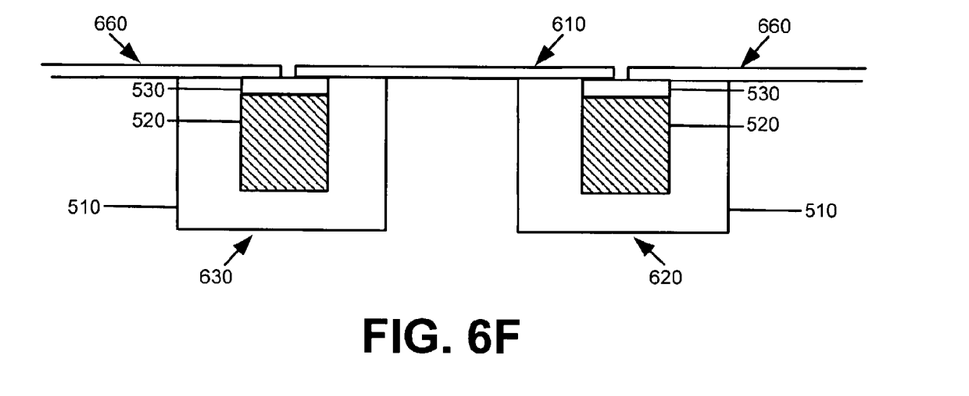

In FIG. 6F, another etching process is performed to remove the conformal structures 650a, 650b.

Figure 6G:
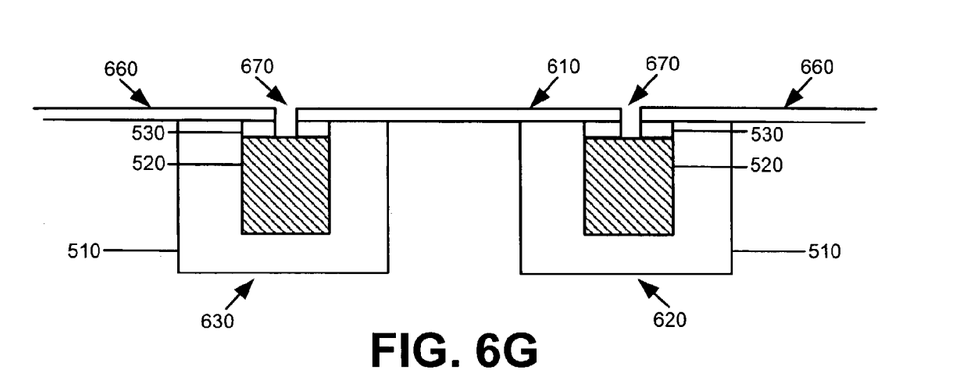

In FIG. 6G, the remaining dielectric layers 610 and 660 are used as a mask to remove a portion of the ferromagnetic cap 430 by an etching process and form gaps 670 that are smaller than the minimum feature size.

Figure 6H:
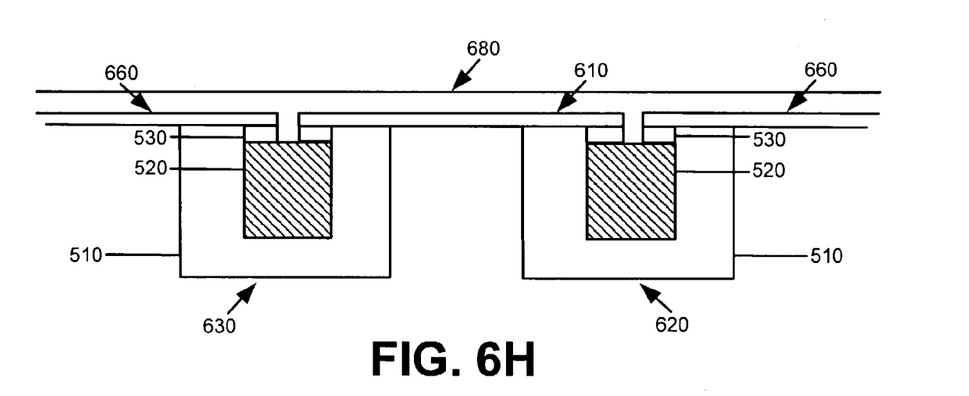

In FIG. 6H, the gaps are filled with a dielectric material 680.

Figure 6I:
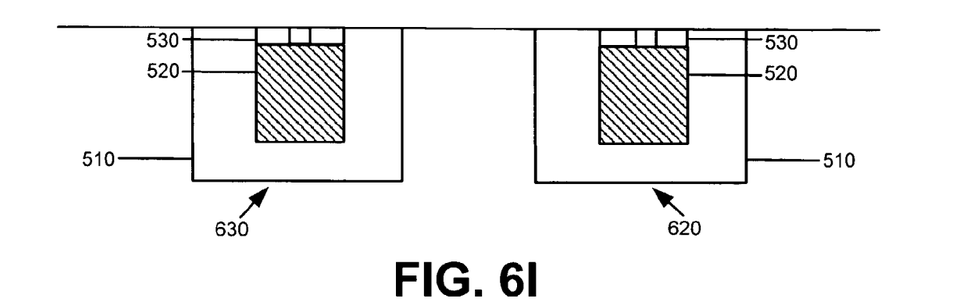

In FIG. 6I, the dielectric mask and other excess dielectric materials are removed by polishing until the ferromagnetic cladding 510 is exposed.

The manufacturing steps illustrated above are merely exemplary. Those skilled in the art will appreciate that other manufacturing steps may be used in accordance with the requirements of a particular implementation. For example, the various layers as illustrated in FIGS. 6A–6I may be formed in accordance with other manufacturing sequences, one or more layers may be formed at the same time, one or more layers of different materials may be combined to form a single layer, etc.

V. An Exemplary Memory Array

Figure 7:
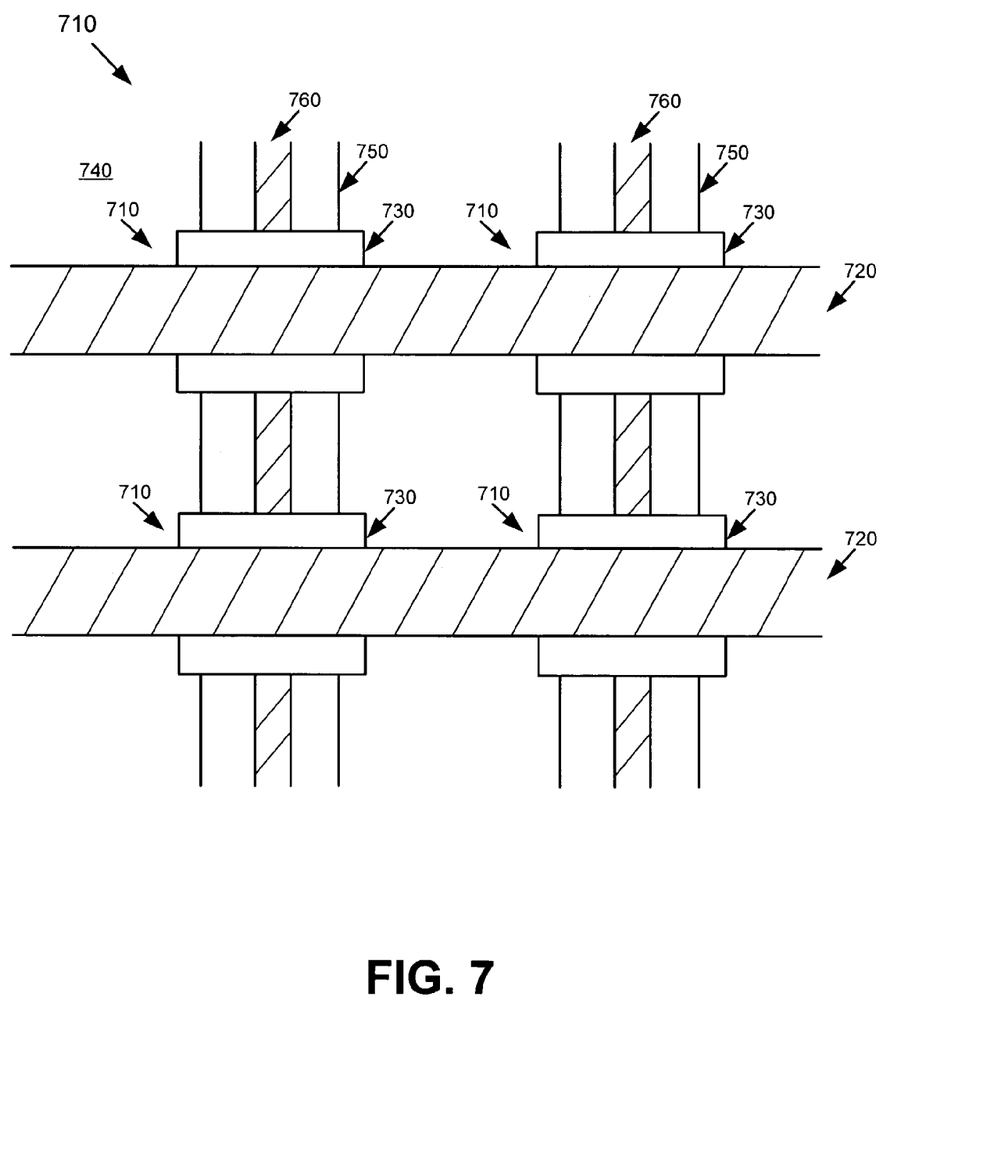
FIG. 7 illustrates a top view of an exemplary memory array including exemplary memory cells of FIG. 2A.

FIG. 7 illustrates a top view of exemplary multiple improved memory cells in a memory array 700. In particular, memory cells as illustrated in FIG. 7 are representative of the exemplary embodiments described above in Sections III (see FIGS. 2A–2B and 3A–3C) from a different perspective. Each exemplary memory cell 710 includes a top conductor 720, a patterned data layer 730 under the top conductor 720, a spacer layer 740 under the data layer 730 and substantially covering the entire memory array, a ferromagnetic cladding 750 under the spacer layer 740, the non-magnetic region 760 located within the ferromagnetic cladding 750, and one or more other components that are hidden from view (e.g., cap, etc.). As illustrated in FIG. 7, physical dimensions of the ferromagnetic cladding 750, the data layer 730 and the top conductor 720 are designed to preclude any overlap of the ferromagnetic cladding 750 and the top conductor 720. Such a physical configuration may substantially eliminate and/or reduce the potential for direct shorting paths between them.

The memory array shown in FIG. 7 is merely illustrative. Thus, one skilled in the art would readily appreciate that other physical configurations may also be implemented in accordance with any particular design requirements.

VI. Conclusion

The foregoing examples illustrate certain exemplary embodiments from which other embodiments, variations, and modifications will be apparent to those skilled in the art. The inventions should therefore not be limited to the particular embodiments discussed above, but rather are defined by the claims.

What is claimed is:

1. A nonvolatile memory array including a plurality of magnetic memory cells, each of said magnetic memory cells comprising:
   a ferromagnetic cladding,
      said cladding at least partially surrounding a non-magnetic region;
   a spacer layer over said ferromagnetic cladding; and
   a ferromagnetic data layer over at least a portion of said spacer layer.

2. The memory array of claim 1, wherein said non-magnetic region comprises a conducting material.

3. The memory array of claim 1, wherein said spacer layer comprises a tunnel barrier material.

4. The memory array of claim 1, wherein said spacer layer comprises a non-magnetic conducting material.

5. The memory array of claim 1, wherein said non-magnetic region comprises an insulating material.

6. The memory array of claim 5, wherein said ferromagnetic cladding enables a current to flow to said magnetic memory cell.

7. The memory array of claim 1, further comprising:
   a conductor over said ferromagnetic data layer.

8. The memory array of claim 7, wherein said conductor is narrower than the width of said data layer in a first dimension and said data layer is at least as wide as said ferromagnetic cladding in a second dimension.

9. A nonvolatile memory array including a plurality of magnetic memory cells, each of said magnetic memory cells comprising:
   a ferromagnetic cladding,
      said cladding at least partially surrounding a non-magnetic region;
   a cap over said non-magnetic region;
   a spacer layer over said cap and said ferromagnetic cladding; and
   a ferromagnetic data layer over at least a portion of said spacer layer.

10. The memory array of claim 9, wherein said cap comprises a dielectric material.

11. The memory array of claim 9, wherein said cap comprises both ferromagnetic and dielectric material.

12. The memory array of claim 9, further comprising:
   a conductor over said ferromagnetic data layer.

13. The memory array of claim 9, wherein said cap comprises a ferromagnetic material.

14. The memory array of claim 13, wherein said ferromagnetic material is different than the material of said ferromagnetic cladding.

15. The memory array of claim 13, wherein said ferromagnetic material comprises materials having a high spin-polarization.

16. The ferromagnetic material of claim 15, wherein said ferromagnetic material comprises half-metallic ferromagnets.

17. The memory array of claim 13, wherein said ferromagnetic material comprises multiple layers of materials that have a low permeability in the direction perpendicular to the length of said ferromagnetic cladding.

18. The memory array of claim 17, wherein said multiple layers comprise at least two ferromagnetic layers, said ferromagnetic layers being separated by a layer of material being selected from a group of materials consisting of Ru, Cu, Cr, Os, or Re.

19. The memory array of claim 13, wherein said cap enhances magnetic tunneling effects of said ferromagnetic cladding.

20. A nonvolatile memory array including a plurality of magnetic memory cells, each of said magnetic memory cells comprising:
   a ferromagnetic cladding;
   a non-magnetic region:
      being at least partially surrounded by said ferromagnetic cladding, and
      comprising an insulating material; a spacer layer over said ferromagnetic cladding;
   a ferromagnetic data layer over at least a portion of said spacer layer; and
   a conductor over said ferromagnetic data layer.

21. A nonvolatile memory array including a plurality of magnetic memory cells, each of said magnetic memory cells comprising:
   a ferromagnetic data layer;
   a spacer layer over said ferromagnetic data layer;
   a ferromagnetic cladding over said spacer layer, said cladding at least partially surrounding a non-magnetic region; and
   a cap between said non-magnetic region and said spacer layer.

22. The memory array of claim 21, wherein said cap includes a ferromagnetic material.

23. The memory array of claim 21, wherein said cap includes a dielectric material.

24. The memory array of claim 21, further comprising a conductor below said ferromagnetic data layer.

25. A method for manufacturing a magnetic memory cell comprising:
   forming a ferromagnetic cladding at least partially surrounding a non-magnetic region;
   forming a spacer layer over at least a portion of said ferromagnetic cladding; and
   forming a ferromagnetic data layer over at least a portion of said spacer layer.

26. The method of claim 25, further comprising:
   forming a cap over said non-magnetic region.

27. The method of claim 26, wherein said cap comprises a ferromagnetic material.

28. The method of claim 26, wherein said cap comprises a dielectric material.

29. The method of claim 25, further comprising:
forming a conductor over said ferromagnetic data layer.

30. The method of claim 29, wherein at least a portion of said conductor is formed along a substantially orthogonal direction to said ferromagnetic cladding.

31. A method for manufacturing a magnetic memory cell, comprising:
  forming a ferromagnetic cladding:
    said cladding at least partially surrounding a non-magnetic region; and
    said non-magnetic region comprising an insulating material;
  forming a spacer layer over said ferromagnetic cladding and said non-magnetic region; and
  forming a ferromagnetic data layer over at least a portion of said spacer layer.

32. A nonvolatile memory array including a plurality of magnetic memory cells, each of said magnetic memory cells being made by a process comprising:
  forming a ferromagnetic cladding having a non-magnetic region;
  forming a spacer layer over said ferromagnetic cladding; and
  forming a ferromagnetic data layer over at least a portion of said spacer layer.

33. A nonvolatile memory array including a plurality of magnetic memory cells, each of said magnetic memory cells comprising:
  (a) means for magnetically storing data;
  (b) means for permitting magnetic tunneling effects during processing of said data; and
  (c) means for separating said (a) from said (b).

34. The memory array of claim 33, further comprising:
  (d) means for reducing interference with said magnetic tunneling effects during said data processing.

35. A nonvolatile memory array including a plurality of magnetic memory cells, each of said magnetic memory cells comprising:
  a ferromagnetic cladding,
    said cladding at least partially surrounding a non-magnetic region;
  a spacer layer over said ferromagnetic cladding; and
  a ferromagnetic data layer over at least a portion of said spacer layer; and
  a conductor over said ferromagnetic data layer,
wherein said conductor is narrower than the width of said data layer in a first dimension and said data layer is at least as wide as said ferromagnetic cladding in a second dimension.

36. A nonvolatile memory array including a plurality of magnetic memory cells, each of said magnetic memory cells comprising:
  a ferromagnetic cladding,
    said cladding at least partially surrounding a non-magnetic region;
  a cap over said non-magnetic region, said cap comprising a ferromagnetic matenal;
  a spacer layer over said cap and said ferromagnetic cladding; and
  a ferromagnetic data layer over at least a portion of said spacer layer.

37. The memory array of claim 36, wherein said ferromagnetic material is different than the material of said ferromagnetic cladding.

38. The memory array of claim 36, wherein said ferromagnetic material comprises multiple layers of materials that have a low permeability in the direction perpendicular to the length of said ferromagnetic cladding.

39. A nonvolatile memory array including a plurality of magnetic memory cells, each of said magnetic memory cells comprising:
  a ferromagnetic cladding,
    said cladding at least partially surrounding a non-magnetic region;
  a cap over said non-magnetic region, said cap comprising a dielectric material;
  a spacer layer over said cap and said ferromagnetic cladding; and
  a ferromagnetic data layer over at least a portion of said spacer layer.

40. A nonvolatile memory array including a plurality of magnetic memory cells, each of said magnetic memory cells comprising:
  a ferromagnetic data layer;
  a spacer layer over said ferromagnetic data layer;
  a ferromagnetic cladding over said spacer layer,
    said cladding at least partially surrounding a non-magnetic region, and
  a cap between said non-magnetic region and said spacer layer, wherein said cap includes a ferromagnetic material.

* * * * *